US008713389B2

(12) United States Patent
Haroun et al.

(10) Patent No.: US 8,713,389 B2
(45) Date of Patent: Apr. 29, 2014

(54) TAP AND LINKING MODULE TDO REGISTER, GATING FOR TCK AND TMS

(71) Applicant: Texas Instruments Incorporated, Dallas, TX (US)

(72) Inventors: Baher S. Haroun, Allen, TX (US); Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/044,535

(22) Filed: Oct. 2, 2013

(65) Prior Publication Data

US 2014/0040689 A1 Feb. 6, 2014

Related U.S. Application Data

(62) Division of application No. 13/737,474, filed on Jan. 9, 2013, now Pat. No. 8,578,225, which is a division of application No. 13/559,251, filed on Jul. 26, 2012, now Pat. No. 8,386,865, which is a division of application No. 13/043,763, filed on Mar. 9, 2011, now Pat. No. 8,255,750, which is a division of application No. 12/539,373, filed on Aug. 11, 2009, now Pat. No. 7,925,942, which is a division of application No. 11/691,600, filed on Mar. 27, 2007, now Pat. No. 7,590,910, which is a division of application No. 10/772,982, filed on Feb. 4, 2004, now Pat. No. 7,213,171, which is a division of application No. 09/981,514, filed on Oct. 16, 2001, now Pat. No. 6,711,707, which is a division of application No. 09/277,504, filed on Mar. 26, 1999, now Pat. No. 6,324,662.

(60) Provisional application No. 60/090,913, filed on Jun. 26, 1998, provisional application No. 60/079,552, filed on Mar. 27, 1998.

(51) Int. Cl.
*G01R 31/28* (2006.01)

(52) U.S. Cl.
USPC .......................... 714/727; 714/733; 714/734

(58) Field of Classification Search
USPC ......... 714/726–729, 738–739, 741–742, 724, 714/30
See application file for complete search history.

(56) References Cited

U.S. PATENT DOCUMENTS

| 8,024,628 B2 * | 9/2011 | Do | 714/718 |
| 8,051,351 B2 * | 11/2011 | Whetsel | 714/734 |
| 8,516,321 B2 * | 8/2013 | Whetsel | 714/729 |

* cited by examiner

Primary Examiner — Christine Tu
(74) Attorney, Agent, or Firm — Lawrence J. Bassuk; Wade J. Brady, III; Frederick J. Telecky, Jr.

(57) ABSTRACT

An architecture for testing a plurality of circuits on an integrated circuit is described. The architecture includes a TAP Linking Module located between test pins on the integrated circuit and 1149.1 Test Access Ports (TAP) of the plurality of circuits to be tested. The TAP Linking Module operates in response to 1149.1 scan operations from a tester connected to the test pins to selectively switch between 1149.1 TAPs to enable test access between the tester and plurality of circuits. The TAP Linking Module's 1149.1 TAP switching operation is based upon augmenting 1149.1 instruction patterns to affix an additional bit or bits of information which is used by the TAP Linking Module for performing the TAP switching operation.

5 Claims, 3 Drawing Sheets

TAP AND LINKING MODULE TDO REGISTER, GATING FOR TCK AND TMS

CROSS REFERENCE TO PRIOR APPLICATIONS

This application is a divisional of application Ser. No. 13/737,474, filed Jan. 9, 2013, now U.S. Pat. No. 8,578,225, issued Nov. 5, 2013;

Which was a divisional of application Ser. No. 13/559,251, filed Jul. 26, 2012, now U.S. Pat. No. 8,386,865, issued Feb. 26, 2013;

Which was a divisional of application Ser. No. 13/043,763, filed Mar. 9, 2011, now U.S. Pat. No. 8,255,750, issued Aug. 28, 2012;

Which was a divisional of application Ser. No. 12/539,373, filed Aug. 11, 2009, now U.S. Pat. No. 7,925,942, issued Apr. 12, 2011;

Which was a divisional of application Ser. No. 11/691,600, filed Mar. 27, 2007, now U.S. Pat. No. 7,590,910, issued Sep. 15, 2009;

Which was a divisional of application Ser. No. 10/772,982, filed Feb. 4, 2004, now U.S. Pat. No. 7,213,171, issued May 1, 2007;

Which was a divisional of application Ser. No. 09/981,514, filed Oct. 16, 2001, now U.S. Pat. No. 6,711,707, issued Mar. 23, 2004;

Which was a divisional of application Ser. No. 09/277,504, filed Mar. 26, 1999, now U.S. Pat. No. 6,324,662, issued Nov. 27, 2001;

Which claimed priority from Provisional Application No. 60/090,913, filed Jun. 26, 1998, and Provisional Application No. 60/079,552, filed Mar. 27, 1998.

This application is related to provisional application Ser. No. 60/024,884, filed Aug. 30, 1996 and application Ser. No. 08/918,872, filed Aug. 26, 1997, now U.S. Pat. No. 6,073,254, issued Jun. 6, 2000, the contents of each of which are incorporated herein by reference.

BACKGROUND OF THE INVENTION

1. Field of the Invention

This invention relates to an improved method and system for testing multiple intellectual property cores contained within an integrated circuit, each core including a standard IEEE-1149.1 compliant test access port (TAP). A core is a predefined subcircuit function, which can be incorporated into the design of an integrated circuit. Some example core functions include but are not limited to: digital signal processors, microcontrollers, microprocessors, and memories. The present invention achieves the above mentioned testing without having to change or modify the standard TAPs of each core. Using the present invention, the TAPs of each core are made selectable such that they can be connected to the integrated circuit pins to enable direct communication between the integrated circuit pins and selected core TAPs.

2. Brief Description of the Prior Art

The IEEE-1149.1 standard, known as JTAG, is a standardized test system developed for testing chips on a board. A trend in the semiconductor industry is for popular chip functions to evolve into intellectual property core circuit functions to allow them to be provided for reuse in the design of larger, more complex integrated circuits. As semiconductor chips evolve into intellectual property cores, the JTAG test system may remain as an integral part of the core. Thus cores will contain the JTAG test system, which facilitates the testing of the cores in chips similar to the way JTAG facilitates the testing of chips on boards.

The present invention assumes plural cores of an integrated circuit each contain a standard IEEE 1149.1 TAP interface comprising a test data input (TDI), test data output (TDO), test mode select (TMS), test clock (TCK), and a test reset (TRST). According to the present invention, as will be described in detail below, a TAP Linking Module is located between the 1149.1 interfaces of the core TAPs and a corresponding 1149.1 test pin interface of the integrated circuit. The TAP Linking Module provides selectivity between the integrated circuit's 1149.1 test pin interface and one or more of the core TAP 1149.1 test interfaces. Core testing takes place by connecting a tester of standard type to the integrated circuit test pins, communicating information via the test pins to the TAP Linking Module to select one or more of the core TAPs to be connected the test pins, and thereafter applying test patterns to the one or more cores via the connection formed by the TAP Linking Module.

It is important to note that some cores use the TAP not only for testing but also for emulation, debug, code development, and system level fault diagnosis. Therefore the present invention not only provides for selective core testing, but also for selective core emulation, debug, code development, and fault diagnosis operations.

A prior art paper entitled "An IEEE 1149.1 Test Access Architecture For ICs With Embedded Cores" by Whetsel was published in the 1997 International Test Conference proceedings, pages 69-78, and is incorporated herein by reference. This paper provides detail on the problems associated with accessing TAPs of cores embedded in integrated circuits. Further, the paper provides a solution to this problem by describing how the design of standard TAPs of cores may be modified to enable them to operate in cooperation with a TAP Linking Module, such that one or more of the modified core TAPs may be selectively accessed for test and emulation via the TAP Linking Module.

Whetsel U.S. Pat. Nos. 5,056,093 and 5,054,024 describe a system for switching between TAPs by use of a Device Select Module (DSM). This approach locates the DSM between the tester and plurality of TAPs to allow the 1149.1 instruction and data scans to pass through the DSM and the currently selected TAPs. 1149.1 instruction and data scans are used to enable the DSM to switch between the TAPs. In this approach the DSM is scanned during every 1149.1 instruction and data scan operation to the selected TAPs. The TAP linking module of the present invention is scanned during every 1149.1 instruction scan operation to the selected TAPs, but not during 1149.1 data scan operations to the selected TAPs. 1149.1 data scan operations to the TAP linking module occurs only when no TAPs are selected for scanning Thus 1149.1 data scans to the TAP linking module occur separate from 1149.1 data scan to the TAPs. The difference therefore between the DSM and TAP linking module is that the DSM is scanned along with the selected TAPs during 1149.1 data scans, while 1149.1 data scans to the TAP linking module occur separate from 1149.1 data scans to the TAPs.

The TAP linking module of the present invention provides the benefits described for the TAP linking module in the Whetsel paper, but without having to modify the design of the standard TAP. The importance of not having to modify the standard TAP can be seen in pre-existing (legacy) core designs which are not modifiable. For example, non-modifiable legacy cores with TAPs may be provided by intellectual property core vendors. Since the cores are not modifiable, their TAPs cannot be modified for use with the TAP Lining Module described in the Whetsel paper. The present invention provides a method of achieving the same advantages stated in the Whetsel paper but without having to modify the TAP design.

As described in the Whetsel paper, existing core TAP access techniques either; (1) provide extra test interface pins (TDI, TDO, TMS, TCK, TRST) on the integrated circuit for each TAP, or (2) string all TAPs together serially via their TDI and TDO signals and in parallel via their TMS, TCK, and TRST signals and connect the TAP string to one set of test interface pins on the integrated circuit. When extra test pins are used, each TAP has its own test interface. However, this approach requires the integrated circuit to have more test pins and the tester to have more scan interface resources. When core TAPs are connected in a string, the speed at which the string of TAPs may be serially operated (i.e. scanned) is dependant upon each TAP's maximum TCK frequency rate. For example, a string of three TAPs may exist where the first TAP can operate at a 40 Mhz maximum TCK rate, the second TAP can operate at a 10 Mhz maximum TCK rate, and the third TAP can operate at a 50 Mhz maximum TCK rate. When scanning the string of TAPs, the TCK frequency rate of the string cannot exceed the maximum TCK rate of the second TAP. Therefore scan operations through the TAP string is limited to 10 Mhz, even though the first and third TAPs can operate at 40 and 50 Mhz, respectively. Also, stringing TAPs together does not allow one TAP to be placed in an 1149.1 RunBist self-test mode while the other TAPs are being scanned.

The present invention, as described in detail below, provides a TAP Linking Module design which uses instruction augmentation to achieve a TAP selection system supporting selectable access of non-modifiable TAPs contained within legacy cores.

SUMMARY OF THE INVENTION

In accordance with the present invention, selection and testing of multiple TAP'ed cores within a large integrated circuit can be performed without adding test interface pins beyond those specified by the IEEE 1149.1 standard, and without modifying the TAP design of the cores. This is accomplished by a novel design of the Tap Linking Module, referred to hereafter as TLM, which eliminates the need to redesign core TAPs.

Briefly, the present invention enables an IEEE 1149.1 test pin interface on an integrated circuit to access any number of standard TAPs within an integrated circuit by providing a TLM that is operable to switch the TAPs to the test pins in response to 1149.1 scan operations. No design modifications are required on TAPs used with the present invention.

It is an object of the present invention to provide the following features.
(1) Provide a TLM architecture for integrated circuits which operates to enable and disable 1149.1 scan access to TAPs without having to modify the design of TAPs. Hence, the invention can be used on legacy cores having non-modifiable TAPs.
(2) Maintain independent development of scan test patterns specific to each embedded core such that the scan test patterns may be directly applied to the core independent of other cores within the integrated circuit. Hence, maintenance and application of core scan test patterns is simplified.
(3) Allow for maximizing the scan test frequency (i.e. TCK frequencies) to each core independent of other cores whose scan test frequency may be less than the scan test frequency of the core being tested. Hence, core test times are reduced.
(4) Ability to re-use, without modification, the test patterns of a core in different integrated circuit designs utilizing the core. Hence, the ease of scan test pattern re-use between integrated circuits utilizing the same core is realized.
(5) Allow for core test integration to become the simple concatenation of the different re-usable scan test patterns of the different cores serially connected to the TLM. Hence, the goal of simplifying multiple core test integration is achieved.

In accordance with the present invention, there is provided a TLM architecture that attains the above described criteria and can accommodate access to multiple TAPs without having to modify the TAP designs. The invention is also compatible with the future looking definition of modifying TAPs as described in the Whetsel paper. The modified TAPs in the Whetsel paper require two extra signals in addition to the five test signals (TDI, TDO, TMS, TCK, TRST) defined in IEEE-1149.1, namely an enable and select signal. The Whetsel paper also requires one or more specific instructions to be added to the TAPs for enabling the switching between multiple TAPs.

The standard TAP as defined in IEEE 1149.1 has two scan operation modes; (1) a data scan operation mode whereby test data is serially communicated through the TAP via the TDI and TDO TAP signals, and (2) an instruction scan operation mode whereby instruction data is serially communicated through the TAP via the TDI and TDO TAP signals.

The present invention exploits the instruction scan operation mode of the TAP to enable the TLM to be loaded with instruction bits which are used to determine which core TAP will be connected to or disconnected from the integrated circuit test pins. During instruction scan operations, instruction data is scanned through both the connected TAP and an augmentation instruction shift register (AISR) within the TLM. The TLM's AISR extend the instruction register length of the connected TAP by the number of the bits within the AISR. Thus during instruction scans, the present invention provides an over-shifting technique which allows instruction data to be loaded in both the instruction register of the connected TAP and the AISR of the TLM. The alignment of the TAP instruction register and the TLM AISR is by design choice. For example, the movement of the instruction data may first proceed through the TAP's instruction register then through the AISR, or the movement of the instruction data may first proceed through the AISR then through the TAP's instruction register.

It is important to note that the TLM's AISR bits are only present in the scan path during TAP instruction scan operations, and not during TAP data scan operations. Thus, modifications of existing test description languages (TDL) that contain both TAP instruction and data scan frames need only modify the instruction scan frames of the TDL to use the present invention. Also, the instruction scan frame modifications only require extending the length of the TDL instruction frames to include the bit positions of the AISR. In each TDL instruction scan frame, the augmentation bits will be set to either; (1) establish a new TAP connection, or (2) maintain the existing TAP connection. Since the TDL data scan frames are not required to be modified by the present invention, core scan test pattern reuse is easily achieved by the present invention.

The concept of augmenting TAP instruction scan lengths to communicate data to a TLM is not limited for use within integrated circuits. For example, a TLM can be used at the board level to make various connection arrangements to TAPs of integrated circuits mounted boards. In this case, the TLM may exists as a separate integrated circuit on the board, or as a subcircuit of an integrated circuit on the board.

Briefly, the above process is accomplished by; (1) adding one or more bits to every TAP instruction scan pattern, (2) communicating the added bit or bits to the AISR of the TLM during instructions scan operations, (3) decoding the added bit or bits at the end of the instruction scan operations, and (4) depending upon the decoding, either maintaining the current TAP connection or forming a new TAP connection.

DESCRIPTION OF THE PREFERRED EMBODIMENT

Figure 1:
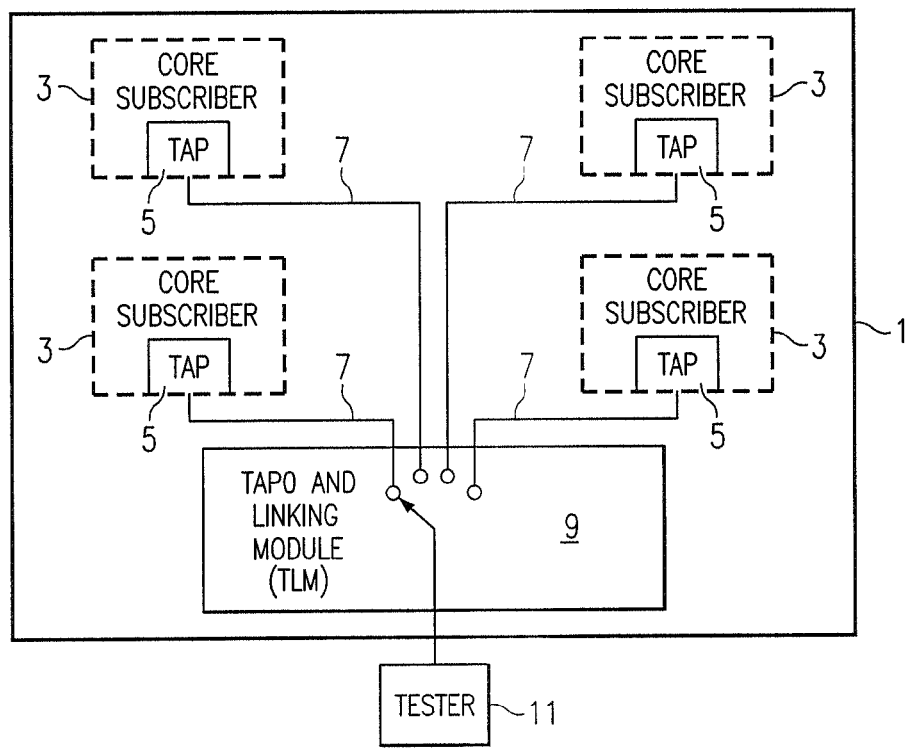
FIG. 1 shows a simple schematic diagram of a tester connected to a TLM circuit which itself is connected to provide access to four core TAPs.

Referring to FIG. 1, there is shown a typical prior art testing system. The testing system includes an integrated circuit 1 having a plurality of cores 3 therein, each core having a TAP 5. Each TAP 5 is coupled to TLM 9 via an associated bus 7. The TLM is coupled external of the integrated circuit to a tester 11. The TLM 9 acts in the manner of a switch to select one of the TAPs 5 via one of the associated busses 7 to be connected to the tester. The tester 11 is coupled to the TLM 9 in accordance with the standard 1149.1 test interface to provide required test inputs to and outputs from a selected TAP 5 via an associated bus 7. While not shown, the tester also provides power and ground to power up the integrated circuit during testing. The TAPs 5 of each core 3 serve as the core's test interface to the TLM 9. When the TLM 9 forms a connection between the tester 11 and one of the core 3 TAPs 5, the connected TAP 5 is controlled by the tester 11 to serially communicate instruction and test data and to execute test operations.

Figure 2:
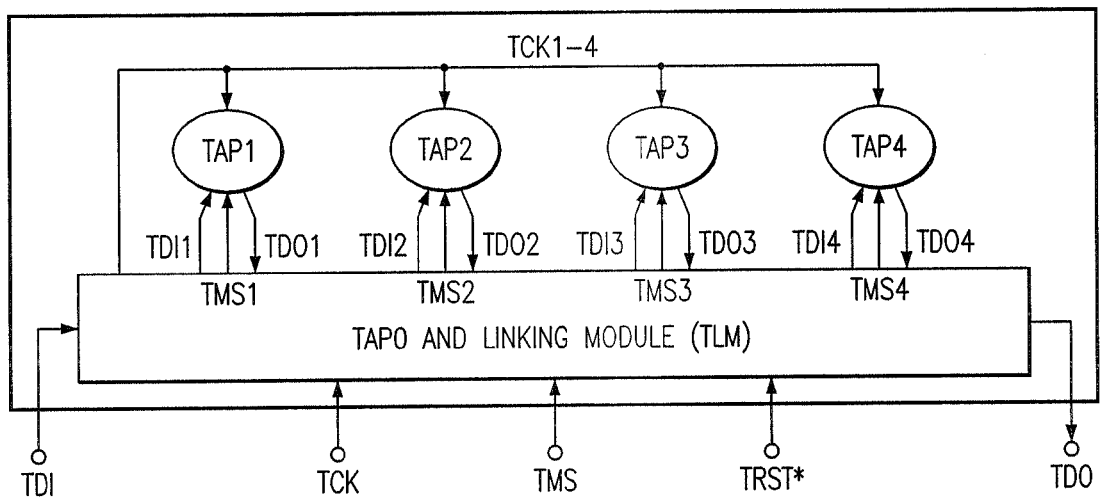
FIG. 2 shows a schematic diagram of the interface connection between the TLM and TAPs 1-4.

Referring to FIG. 2, there is shown schematically and in more detail how multiple TAPs 1-4 can be connected to a TLM. TAP 0 resides within the TLM. The TLM comprises first and second interfaces. The first interface is connected to the 1149.1 TDI, TCK, TMS, TRST, TDO signals on the integrated circuits test pins. The second interface is connected to the 1149.1 TDI1-4, TMS1-4, TDO1-4, TCK1-4 signals to each TAP 1-4. During test, the TDI, TDO, TMS, and TCK test pins will be connected to one of the TAPs 1-4, via the TLM, to enable the tester 11 of FIG. 1 to communicate with the TAP.

In this example, TAP1 is the TAP connected to the test pins following power up of the integrated circuit or following activation of the TRST signal. TAP1 serves as the integrated circuit's TAP and regulates the JTAG boundary scan test operations of the integrated circuit. TAP switching occurs by a tester, connected to the integrated circuit's test pins, performing an augmented 1149.1 instruction scan operation through TAP1 and the TLM. Following the augmented 1149.1 instruction scan operation, the TLM only is selected for scanning by an 1149.1 data scan operation to load a new TAP connection configuration. Following the 1149.1 data scan operation to the TLM, the new TAP connection occurs and the tester accesses the new TAP, say TAP2, via the test pins.

Figure 3A:
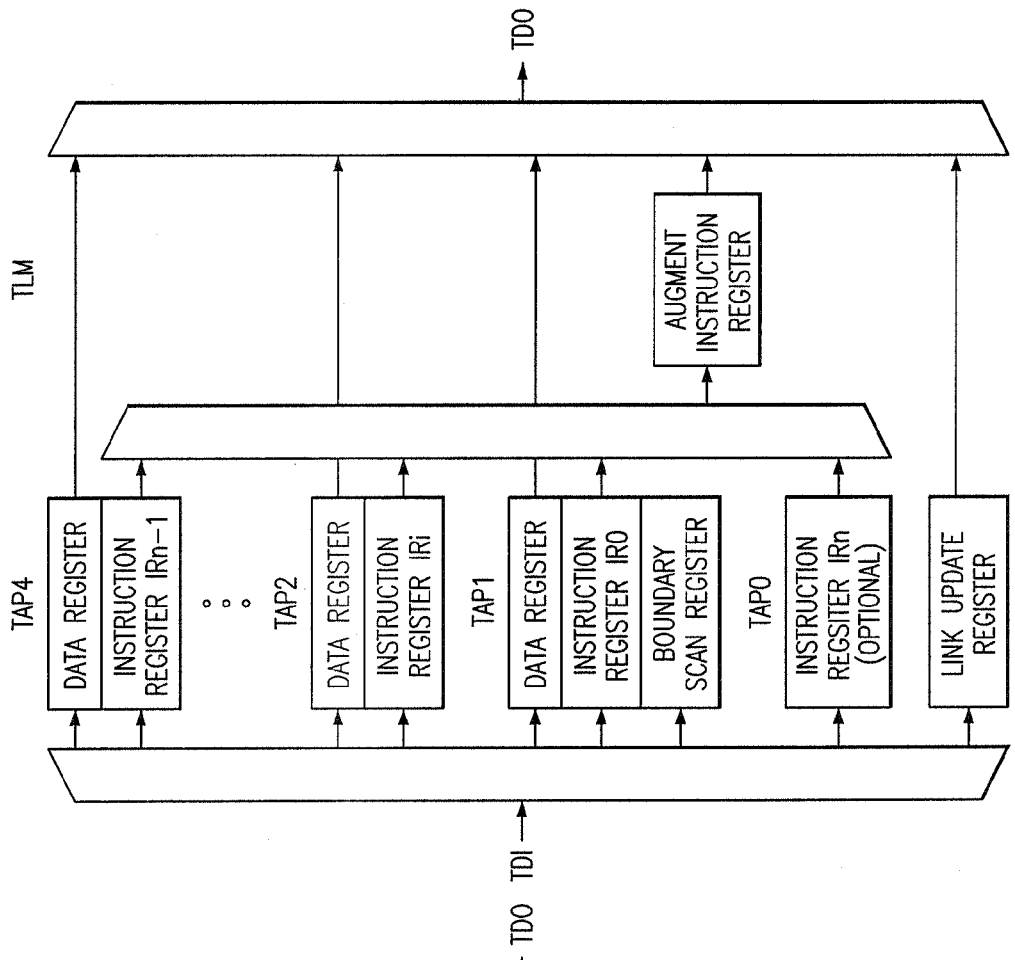
FIG. 3a shows a TLM design where individual augmentation instruction registers exist for each TAP.
Figure 3B:
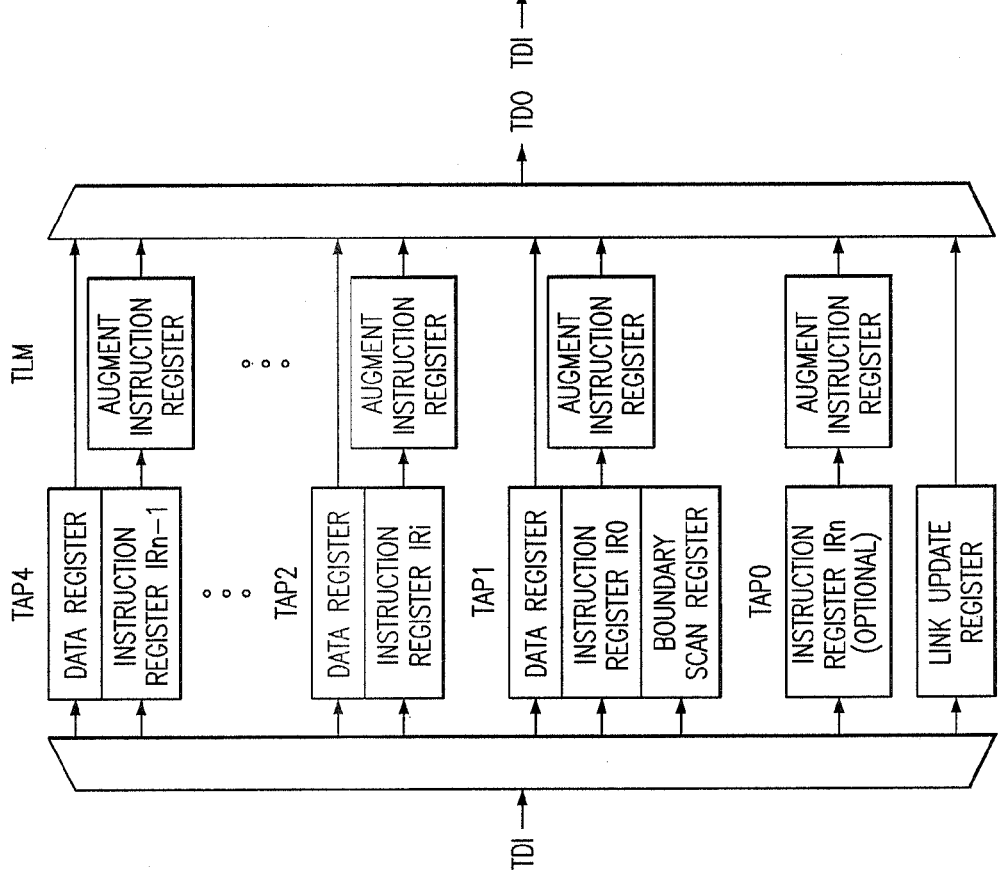
FIG. 3B shows a TLM design where one augmentation instruction register shared by all TAPs.

Referring now to FIGS. 3a and 3b, the basic TLM concept of the present invention is seen depending upon augmenting all instruction scan operations by one or more bits using an augmentation instruction register within the TLM. In FIGS. 3a and 3b, TAP0 represents the TAP within the TLM, TAP1 represent the integrated circuit TAP, and TAPs 2-4 represent TAPs in cores. This simplified view of how TAPs are associated with the TLM's augmentation instruction register illustrates; (1) how 1149.1 data scan operations shift data through the selected TAP's data register to be passed to the integrated circuits TDO pin via the TLM, and (2) how 1149.1 instruction scan operations shift data through the selected TAP's instruction register and TLM's augmentation instruction register prior to passing on the integrated circuits TDO pin.

The difference between the embodiments of FIGS. 3a and 3b is that each TAP in FIG. 3a has its own TLM augmentation instruction register, whereas, in FIG. 3b, a single TLM augmentation instruction register is shared by all TAPs. From inspection of FIGS. 3a and 3b, the concept of augmenting only instructions scan operations with an additional bit or bits is clearly seen. It is important to note that the arrangement of the TAPs and TLM in FIGS. 3a and 3b could be reversed to where 1149.1 data and instruction scan operations transmit through the TLM before transmitting though the TAPs without departing from the instruction augmentation concept set forth in the present invention.

Figure 4:
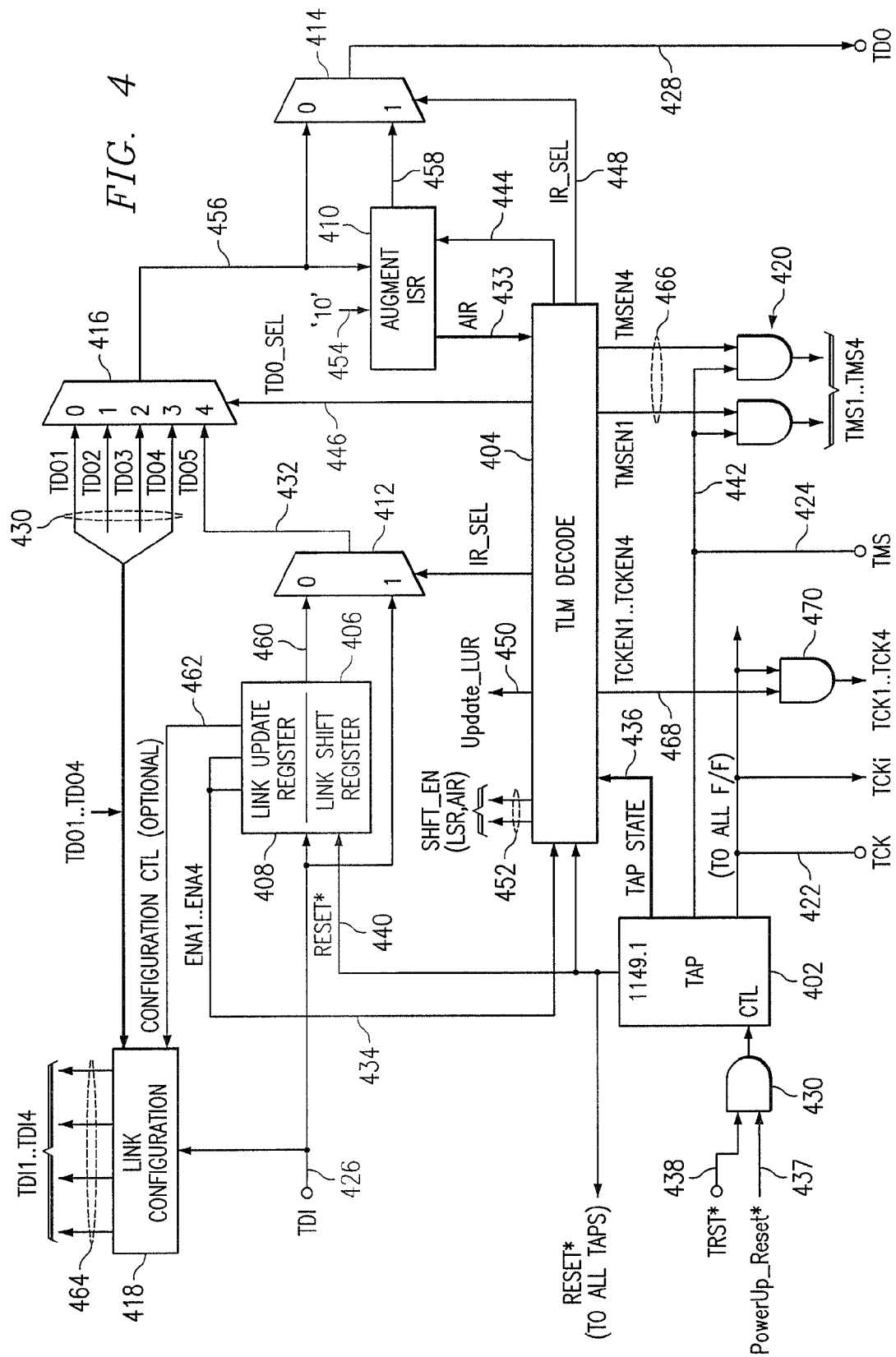
FIG. 4 shows a detailed TLM architecture according to the present invention.

Referring to FIG. 4, there is shown the TLM structure which is composed of a TAP state machine 402, a TLM decode 404, a link shift register 406, a link update register 408, an augmentation instruction shift register (AISR) 410, TLM instruction or data scan multiplexer 412, TLM instruction or data scan multiplexer 414, TDO1-5 multiplexer 416, and an optional TAP TDI link configuration circuit 418. TCK 422, TMS 424, TDI 426, TDO 428, and TRST 438 signals are connected to test pins of the integrated circuit.

TAP state machine 402 is connected to the output of gate 430 for a receiving reset input. Gate 430 has inputs for receiving a power up reset signal 437 from a power up reset circuit within the integrated circuit and a TRST signal 438 from a test pin of the integrated circuit. TAP state machine 402 also receives the TCK 422 and TMS 424 signals. TAP state machine 402 outputs TAP state signals 436 to the TLM decode 404, a reset signal 440 to TLM decode 404, link shift register 406, and link update register 408, and a TMS gating signal 442 to gates 420.

TLM decode 404 receives the TAP state signals 436, control signal 433 from the AISR 410, enable signals 434 from link update register 408, and the reset signal 440. TLM decode 404 outputs an IR-SEL signal 448 to multiplexers 412 and 414, a capture control signal 444 to AISR 410, TDO-SEL signal 446 to multiplexer 416, update signal 450 to link update register 408, and shift enable signals 452 to link shift register 406.

AISR 410 receives serial data output 456 from multiplexer 416, capture, shift, update, and reset bus signals 444 from TLM decode 404, and a parallel, fixed 1 and 0 signal input 454. The AISR 410 outputs a serial data signal 458 to multiplexer 414 and an enable signal 433 to the TLM decode 404. The AISR 410 responds to bus 444 to perform capture, shift, and update operations during all 1149.1 scan operations.

Link shift register 406 inputs TDI 426, reset signal 440, and shift enable signals 452. Link shift register 406 outputs data signal 460 to multiplexer 412. Update register 408 is coupled to receive data from link shift register 406 and inputs reset signal 440, and update signal 450. Update register 408 outputs enable signals 434 to TLM decode 404 and optional configuration signals 462 to optional link configuration circuit 418.

Multiplexer 412 receives data signal 460 from link shift register 406 and TDI signal 426. Multiplexer 412 outputs data 432 to multiplexer 416. Multiplexer 414 receives data signal 456 from multiplexer 416 and data signal 458 from AISR 410. Multiplexer 414 outputs data to TDO 428. Multiplexer 416 receives the TAPs TDO1-4 outputs 430 and data output 432 from multiplexer 412. Multiplexer 416 outputs data 456 to multiplexer 414.

Optional link configuration circuit 418 inputs TDI 426, configuration control signals 462, and TAP TDO signals 430. Link configuration circuit 418 outputs TAP TDI 1-4 signals 464. The circuit 418 serves to programmably connect, in response to control signals 462, TDI 426 to one of the TDI1-4 TAP inputs. To simplify the following description, it will be assumed that TDI 426 will be connected to all TDI1-4 TAP inputs. The Whetsel paper and application Ser. No. 08/918, 872 describe use of TDI linking circuits like that of circuit 418.

The operational description of the FIG. 2 and FIG. 4 TLM circuits is best understood by initializing the TLM using a reset input from gate 430. In response to the reset input, the TAP state machine 402 is reset. When reset, TAP state machine 402 outputs a reset signal 440 to reset the TLM decode 404, link shift register 406, link update register 408, and all TAPs 1-4 connected to the TLM as shown in FIG. 2. The reset signal 440 also resets the AISR 410 via bus 444 to a code that is input to TLM decode 404 via signal 433. Following reset, link update register 408 outputs enable signals 434 to TLM decode 404 and enable TAP1 of FIG. 2 to be the only TAP, external of the TLM, enabled and connected to the test pins of the integrated circuit, via the TLM. The TLM's TAP state machine 402 (TAPO of FIG. 2) is also enabled and connected to the test pins so that it can track the state of the test pins to know what 1149.1 operation is being performed.

During an 1149.1 data scan operation, TAP 1 receives control from TMS1 and TCK1 from the TLM to input data from TDI 426 and shift the data through a data register (TAP 1's Bypass register) to TAP 1's TDO1 output 430. The TDO1 output 430 passes through TLM multiplexers 416 and 414 to be output on TDO 428. During this 1149.1 data scan operation, no data is input to the link shift register 406 from TDI 426 since the TLM decode 404 is disabled by the AISR 410 reset code input 433 from responding to TAP state machine 402 control bus 436 to output shift enable signals 452 to the link shift register 406.

During an 1149.1 instruction scan operation, TAP 1 receives control from TMS1 and TCK1 from the TLM to input data from TDI 426 and shift the data through its instruction register to TAP 1's TDO1 output 430. The TDO1 output 430 passes through multiplexers 416 to be input to AISR 410, is shifted through AISR 410 to be output on TDO 428, via multiplexer 414. During this 1149.1 instruction scan operation the need to add bits to the 1149.1 instruction scan frame is seen from the fact that the AISR 410 lies in series with the TAP1 instruction register. With a two bit shift register AISR 410, as shown in this example, two bits will be added or augmented to the length of the instruction scan frame to allow shifting a two bit code into the AISR 410 during instruction scan operations.

Prior art 1149.1 instruction or data scan operations comprise the steps of capturing data into an instruction or data register, shifting data through an instruction or data register, and updating data from an instruction or data registers. During the above mentioned instruction scan operation, the AISR 410 captures a two bit 10 input 454 code, then performs the shift and update steps. This two bit 10 input code enables the AISR to output a leading 1 then 0 bit during the shift step to be compatible with what conventional 1149.1 instructions register must output to comply with the 1149.1 standard. Thus the two bit 10 input code is provided for compatibility with 1149.1. If 1149.1 did not have this initial 1 then 0 bit shift out requirement, the ASIR 410 could be implemented as a single bit shift register.

The two bits shifted into the AISR 410 during the above mentioned 1149.1 instruction scan operation must provide at least two codes, a TAP scan code and a TLM scan code. The TAP scan code operates to enable scan operations through the currently selected TAP from TDI 426 to TDO 428, and disable scan operations through the TLM's link update register from TDI 426 to TDO 428. The TLM scan code operates to enable scan operations through the TLM's link shift register from TDI 426 to TDO 428 and disable scan operations through the currently selected TAP from TDI 426 to TDO 428. During reset, the AISR 410 is reset to the TAP scan code and the link update register 408 is reset to connect TAP1 to the test pins. The reset condition of AISR 410 and link update register 408 are input to TLM decode 404 via busses 433 and 434, respectively, for decoding.

If, following the above mentioned 1149.1 instruction scan operation, the AISR 410 was loaded with a TAP scan code, no change would occur in the TLM or in the current selection of TAP1 being the TAP connected to the integrated circuits test pins. If a TAP scan code was loaded, the above described 1149.1 data and instruction scan access operations of TAP1 could be repeated. However, if the AISR 410 was loaded with a TLM scan code during the above mentioned 1149.1 instruction scan operation, the following TLM changes would occur. First, scan access to the currently selected TAP1 would be disabled by the TCK1-4 and TMS1-4 outputs of gates 470 and 420, respectively, being gated low by TCKEN 468 and TMSEN1-4 signals 466 from the TLM decode 404. Second, scan access to the link shift register 406 and link update register 408 would be enabled by the shift enable signals 452 and update signal 450 from TLM decode 404. These changes in the TLM would occur in response to the instruction register update step which occurs at the end of the above mentioned 1149.1 instruction scan operation.

Assuming a TLM scan code were loaded into the AISR 410, a subsequent 1149.1 data register scan operation would cause the TAP state machine 402 to output control 436 to cause control 452 to enable data on TDI 426 to be shifted through link shift register 406 to TDO 428, via multiplexers 412, 416, and 414. Following this data shift operation, update control on bus 436 from TAP state machine 402 will cause control 450 from TLM decode 404 to update data shifted into the link shift register 406 into the link update register 408. Following the update operation, the enable outputs 434 from the link update register are input to the TLM decode 404 to bring about a new desired TAP connection arrangement to the integrated circuits test pins. Also, in response to the update operation the AISR is reset via bus 444 to contain the TAP scan code to enable the new TAP connection arrangement to be immediately available for 1149.1 instruction and data scan operations, via the test pins.

If, while the AISR 410 contained the above mentioned TLM scan code, an 1149.1 instruction scan operation were performed instead of an 1149.1 data register scan operation, data on TDI 426 would pass through multiplexers 412 and 416 to be shifted through the AISR 410 and output to TDO 428, via multiplexer 414. In this case the current TLM configuration would be maintained, since the link shift and update registers do not receive data register scan control on the shift enable 452 and update 450 control signals to shift and update data from TDI 426 and TDO 428. Since the AISR 410 is included in the TDI 426 and TDO 428 path through the TLM during instruction scans, it can be loaded with either a TLM or TAP scan code. If a TAP scan code is loaded into the AISR 410, the current TAP configuration is again available for 1149.1 scan access, via the integrated circuits test pins. During instruction scan operations with the AISR containing a TLM scan code, the TAPs 1-4 are disabled and do not respond to the instruction scan operation, as mentioned above for data register scan operations with the AISR 410 containing the TLM scan code. If desired an instruction register may be implemented in the TLM in place of directly wiring TDI 426 to input 1 of multiplexer 412. If implemented, the instruction register's input is connected to the node where TDI 426 inputs to the linking shift register 406 and the instruction register's output is connected to input 1 of multiplexer 412, i.e. the instruction register will be in parallel with the linking shift register 406. Providing an instruction register in the TLM enables it to have instruction capabilities that may provide useful expanded TLM capabilities.

It is important to note that other AISR codes may be defined for use by the TLM of the present invention. For example, a TLM scan code-A may be defined to modify the behavior of the TLM to where 1149.1 instruction scan operations, occurring while the AISR contains the TLM scan code-A, shifts instruction data through the currently selected TAP instead of through the TLM as described above. In response to a TLM scan code-A, the TLM decode 404 would be configured to respond to 1149.1 instruction scan control outputs on bus 436 of TAP state machine 402 to enable the appropriate TCK1-4 and TMS1-4 signals to perform the instruction scan operation on the currently selected TAP. During the instruction scan operation, the link shift and update registers 406 and 408 are disabled by the TLM decode 404. This mode of accessing the currently selected TAP during 1149.1 instruction scan operations occurring when the TLM is selected for 1149.1 data scan operations is consistent with the way the TLM of the Whetsel paper and patent application Ser. No. 08/918,872 behaves. Thus behavioral consistency is achieved between the two TLM types using a TLM scan code-A.

When the TLM is updated with a new TAP connection configuration, following the above mentioned data register scan operation, the newly selected TAP, say TAP2, is available for 1149.1 scan access via the test pins. The previously selected TAP1 is disabled from 1149.1 scan access. Control input 446 to multiplexer 416 from TLM decode 404 will be set by the enable bus 434 output from link update register 408 to connect the TDO output of the newly selected TAP, for example TDO2 will be selected for TAP2, TDO3 for TAP3, and TDO4 for TAP4.

The above process of augmenting instruction scans to a currently selected TAP to include a TLM scan code to be loaded into the AISR 410 can be repeated whenever a new TAP connection to the test pins is required to meet a test or emulation access need. It is important to note that only 1149.1 instruction scan frames need to be augmented to include the AISR code, and not 1149.1 data scan frames. Therefore, the present invention does not require modification of test data scan frames (TDL), which facilitates reuse of the test data scan frames.

The basic function of the TLM of the present invention to control and access embedded TAPs within integrated circuits is very similar to the TLM described in the Whetsel paper and patent application Ser. No. 08/918,872. The novelty introduced by the TLM of the present invention lies in its use of an AISR 410 and the augmentation of instruction scan frames to include the AISR 410 codes. The TLM of the Whetsel paper and patent application Ser. No. 08/918,872 used additional TAP communication signals, referred to as select and enable signals, to achieve control and access of embedded TAPs. The TLM of FIG. 4 does not require use of these additional TAP signals. Thus the TLM of FIG. 4 may be used with standard, non-modified 1149.1 TAPs.

The TLM of the present invention provides a process for changing TAP connections comprising the steps of; (1) performing an 1149.1 instruction scan operation augmented with a code for accessing the TLM, (2) performing an 1149.1 data scan operation to load the TLM with a new TAP connection configuration, and (3) performing 1149.1 instruction and data scan operations on the new TAP connection.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. An integrated circuit comprising:
   A. a TDI input lead, a TCK input lead, a TMS input lead, and a TDO output lead;
   B. a TDI1 output lead, a TCK1 output lead, a TMS1 output lead, and a TDO1 input lead;
   C. TAP linking module circuitry including:
      i. a register coupled between the TDO input lead and the TDO output lead and having an Enable1 output; and
      ii. gating circuitry having inputs coupled to the TCK input lead and the TMS input lead, enable1 inputs coupled to the Enable1 output, and outputs coupled to the TCK1 output lead and the TMS1 output lead.

2. The integrated circuit of claim 1 in which the TAP linking module circuitry includes decode circuitry having inputs connected to the Enable1 output of the register and enable outputs connected to the enable inputs of the gating circuitry.

3. The integrated circuit of claim 1 in which the TAP linking module circuitry includes a TAP state machine having inputs connected to the TCK input lead and to the TMS input lead, and having state outputs coupled to the register.

4. The integrated circuit of claim 1 in which the TAP linking module circuitry includes multiplexer circuitry having an input coupled to the TDO1 input lead and an output coupled to the TDO output lead.

5. The integrated circuit of claim 1 in which the register includes an Enable2 output, and the gating circuitry includes enable2 inputs coupled to the Enable2 output, and outputs coupled to a TCK2 output lead and a TMS2 output lead.

* * * * *